United States Patent
Kagawa et al.

(10) Patent No.: US 9,614,029 B2
(45) Date of Patent: Apr. 4, 2017

(54) TRENCH-GATE TYPE SEMICONDUCTOR DEVICE AND MANUFACTURING METHOD THEREFOR

(71) Applicant: Mitsubishi Electric Corporation, Chiyoda-ku (JP)

(72) Inventors: Yasuhiro Kagawa, Tokyo (JP); Akihiko Furukawa, Tokyo (JP); Shiro Hino, Tokyo (JP); Hiroshi Watanabe, Tokyo (JP); Masayuki Imaizumi, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/930,373

(22) Filed: Nov. 2, 2015

(65) Prior Publication Data

US 2016/0071922 A1  Mar. 10, 2016

Related U.S. Application Data

(62) Division of application No. 13/992,574, filed as application No. PCT/JP2011/078022 on Dec. 5, 2011, now Pat. No. 9,224,860.

(30) Foreign Application Priority Data

Dec. 10, 2010 (JP) .................. 2010-275289

(51) Int. Cl.
*H01L 29/66* (2006.01)
*H01L 29/06* (2006.01)
(Continued)

(52) U.S. Cl.
CPC ........ *H01L 29/063* (2013.01); *H01L 29/0623* (2013.01); *H01L 29/0696* (2013.01);
(Continued)

(58) Field of Classification Search
CPC ............. H01L 29/0696; H01L 29/7813; H01L 29/4238; H01L 29/0623; H01L 29/0634;
(Continued)

(56) References Cited

U.S. PATENT DOCUMENTS 6,114,727 A  9/2000  Ogura et al.
6,501,129 B2  12/2002  Osawa
(Continued)

FOREIGN PATENT DOCUMENTS

CN  101064308 A  10/2007
CN  101552292 A  10/2009
(Continued)

OTHER PUBLICATIONS

International Search Report Issued Feb. 21, 2012 in PCT/JP11/078022 Filed Dec. 5, 2011.
(Continued)

*Primary Examiner* — Julio J Maldonado
*Assistant Examiner* — Cory Eskridge
(74) *Attorney, Agent, or Firm* — Oblon, McClelland, Maier & Neustadt, L.L.P.

(57) ABSTRACT

There is provided a trench-gate type semiconductor device that can prevent breakdown of a gate insulating film caused by a displacement current flowing into a protective diffusion layer at a portion of a trench underlying a gate electrode at a turn-off time and simultaneously improves a current density by narrowing a cell pitch. The semiconductor device has a gate electrode 7 embedded into a trench 5 penetrating a base region 3. The gate electrode 7 is disposed into a lattice shape in a planar view, and a protective diffusion layer 13 is formed in a drift layer 2a at the portion underlying thereof. At least one of blocks divided by the gate electrode 7 is a protective contact region 20 on which the trench 5 is entirely formed. A protective contact 21 for connecting the protec-
(Continued)

tive diffusion layer 13 at a bottom portion of the trench 5 and a source electrode 9 is disposed on the protective contact region 20.

16 Claims, 12 Drawing Sheets

(51) Int. Cl.
| | |
|---|---|
| *H01L 29/16* | (2006.01) |
| *H01L 29/417* | (2006.01) |
| *H01L 29/739* | (2006.01) |
| *H01L 29/78* | (2006.01) |
| *H01L 29/10* | (2006.01) |
| *H01L 29/20* | (2006.01) |
| *H01L 29/423* | (2006.01) |

(52) U.S. Cl.
CPC ...... *H01L 29/1095* (2013.01); *H01L 29/1608* (2013.01); *H01L 29/41766* (2013.01); *H01L 29/66068* (2013.01); *H01L 29/66348* (2013.01); *H01L 29/66666* (2013.01); *H01L 29/66727* (2013.01); *H01L 29/66734* (2013.01); *H01L 29/7397* (2013.01); *H01L 29/7811* (2013.01); *H01L 29/7813* (2013.01); *H01L 29/7827* (2013.01); *H01L 29/2003* (2013.01); *H01L 29/4238* (2013.01); *H01L 29/42376* (2013.01)

(58) Field of Classification Search
CPC ............. H01L 29/1095; H01L 29/407; H01L 29/7397; H01L 29/41766; H01L 29/7802; H01L 29/7827; H01L 29/0619; H01L 29/41741; H01L 29/41758; H01L 29/4236; H01L 29/42372; H01L 29/42376; H01L 29/66333; H01L 29/66348; H01L 29/7395; H01L 29/8122; H01L 29/66666; H01L 29/7811; H01L 29/66068; H01L 29/66727; H01L 29/2003; H01L 29/66734; H01L 21/26586; H01L 21/823487
See application file for complete search history.

(56) References Cited

U.S. PATENT DOCUMENTS

| | | | |
|---|---|---|---|
| 6,600,194 B2 | 7/2003 | Hueting et al. | |
| 6,627,499 B2 | 9/2003 | Osawa | |
| 7,973,381 B2 | 7/2011 | Chiola | |
| 7,999,312 B2 | 8/2011 | Takaya et al. | |
| 8,076,718 B2 | 12/2011 | Takaya et al. | |
| 2003/0040144 A1* | 2/2003 | Blanchard | H01L 29/7813 438/145 |
| 2006/0289928 A1 | 12/2006 | Takaya et al. | |
| 2010/0213505 A1* | 8/2010 | Hirler | H01L 27/0727 257/139 |
| 2010/0258863 A1 | 10/2010 | Kaneko | |
| 2011/0210392 A1 | 9/2011 | Nakata et al. | |

FOREIGN PATENT DOCUMENTS

| | | |
|---|---|---|
| CN | 100557819 C | 11/2009 |
| JP | 05-007002 | 1/1993 |
| JP | 10-107280 A | 4/1998 |
| JP | 10 256550 | 9/1998 |
| JP | 11 17176 | 1/1999 |
| JP | 2001 284584 | 10/2001 |
| JP | 2003 526948 | 9/2003 |
| JP | 2005-501408 A | 1/2005 |
| JP | 2006 128507 | 5/2006 |
| JP | 2008 85086 | 4/2008 |
| JP | 2008-135522 A | 6/2008 |
| JP | 2008-177335 A | 7/2008 |
| JP | 2009-43966 A | 2/2009 |
| JP | 4453671 | 4/2010 |
| JP | 2010 109221 | 5/2010 |
| JP | 2010 114152 | 5/2010 |
| JP | 2010 251422 | 11/2010 |
| WO | 2010 073759 | 7/2010 |

OTHER PUBLICATIONS

Written Opinion of the International Searching Authority Issued Feb. 21, 2012 in PCT/JP2011/078022 (with English translation).
International Preliminary Report on Patentability Issued Jun. 20, 2013 in PCT/JP2011/078022 (English translation only).
Office Action issued May 20, 2014 in Japanese Patent Application No. 2012-547837 (with English language translation).
Combined Office Action and Search Report issued Apr. 28, 2015 in Chinese Patent Application No. 201180059464.4 (with English language translation).
Office Action issued Nov. 11, 2014, in Japanese Patent Application No. 2012-547837 with partial English translation.
Combined Office Action and Search Report issued Jan. 29, 2016 in Chinese Patent Application No. 201180059464.4 (with English language translation).

* cited by examiner

F I G . 3
(a) 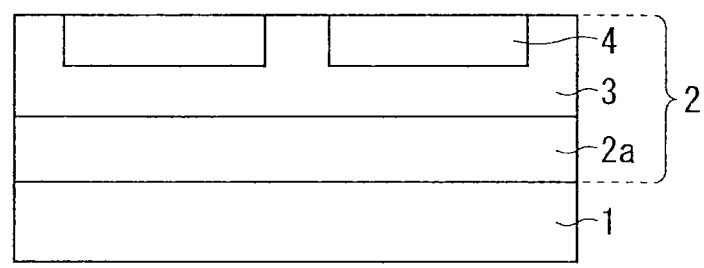
(b) 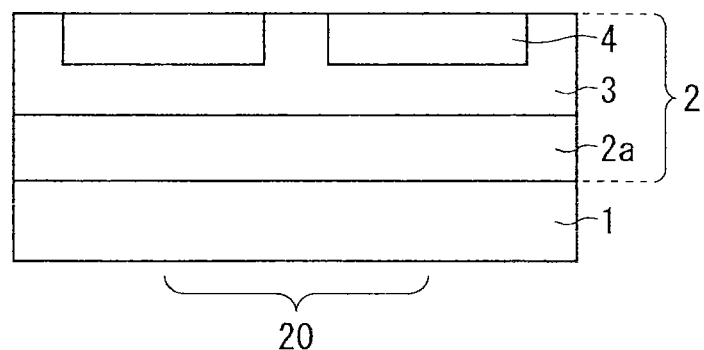

F I G . 6
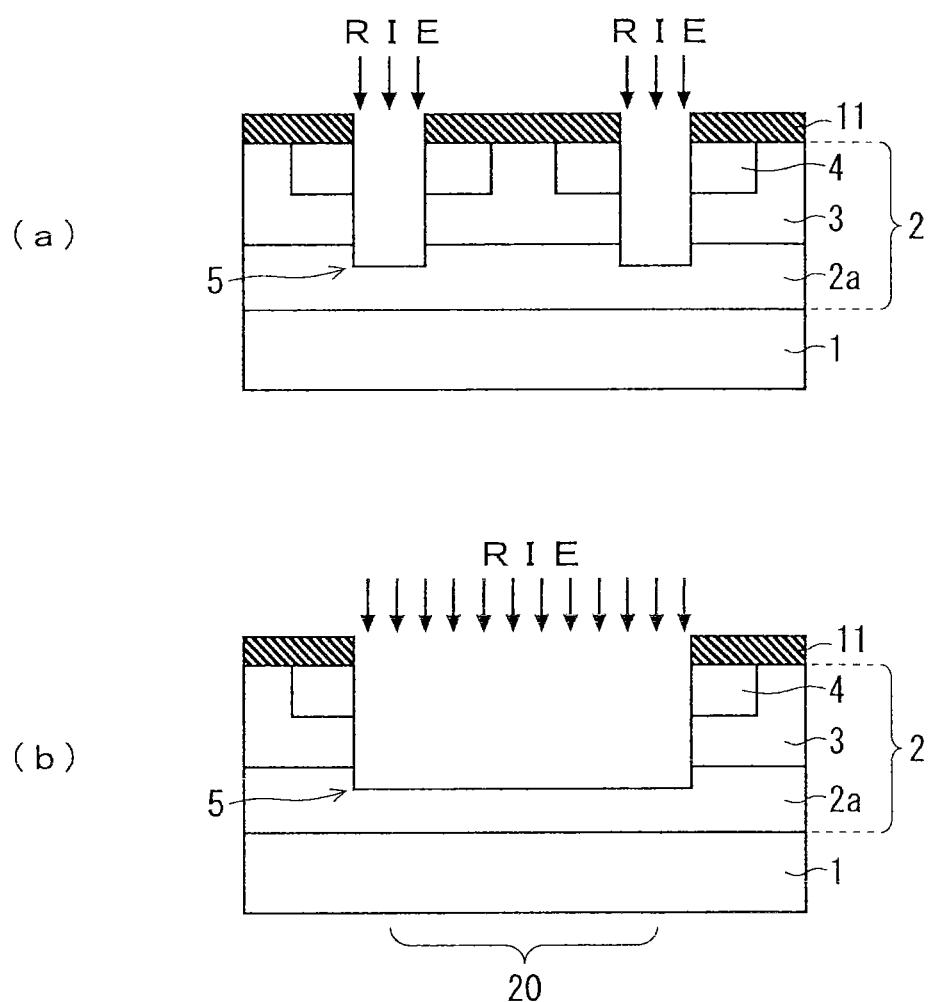

F I G . 8
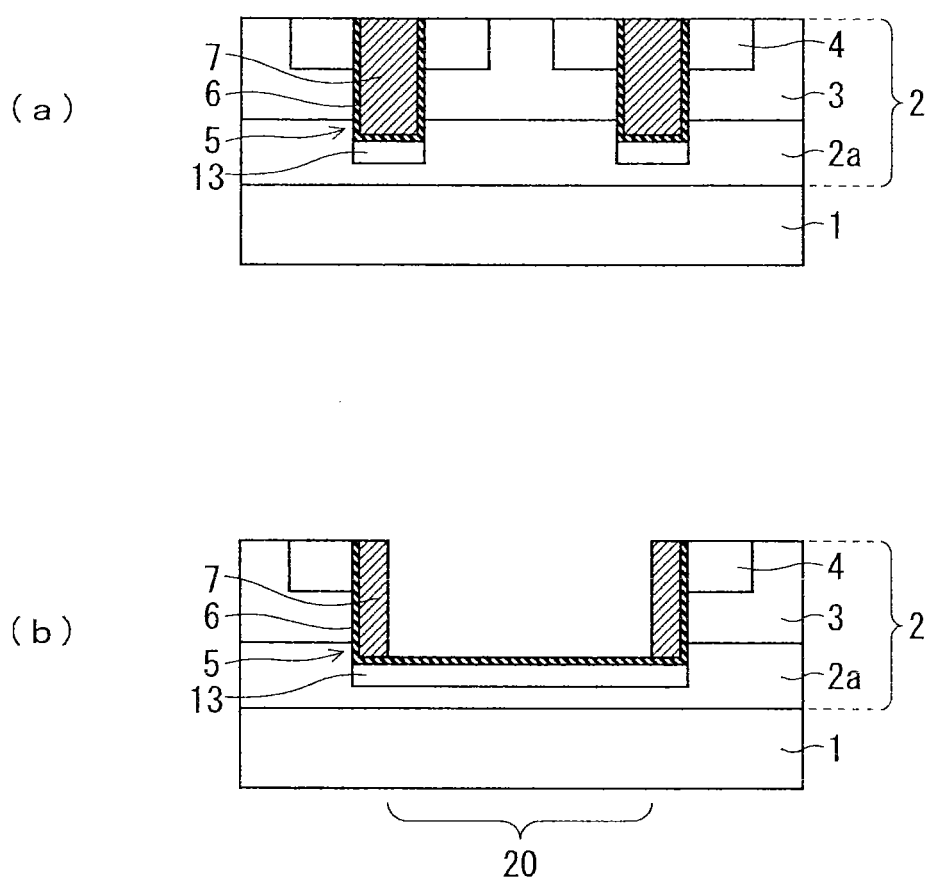

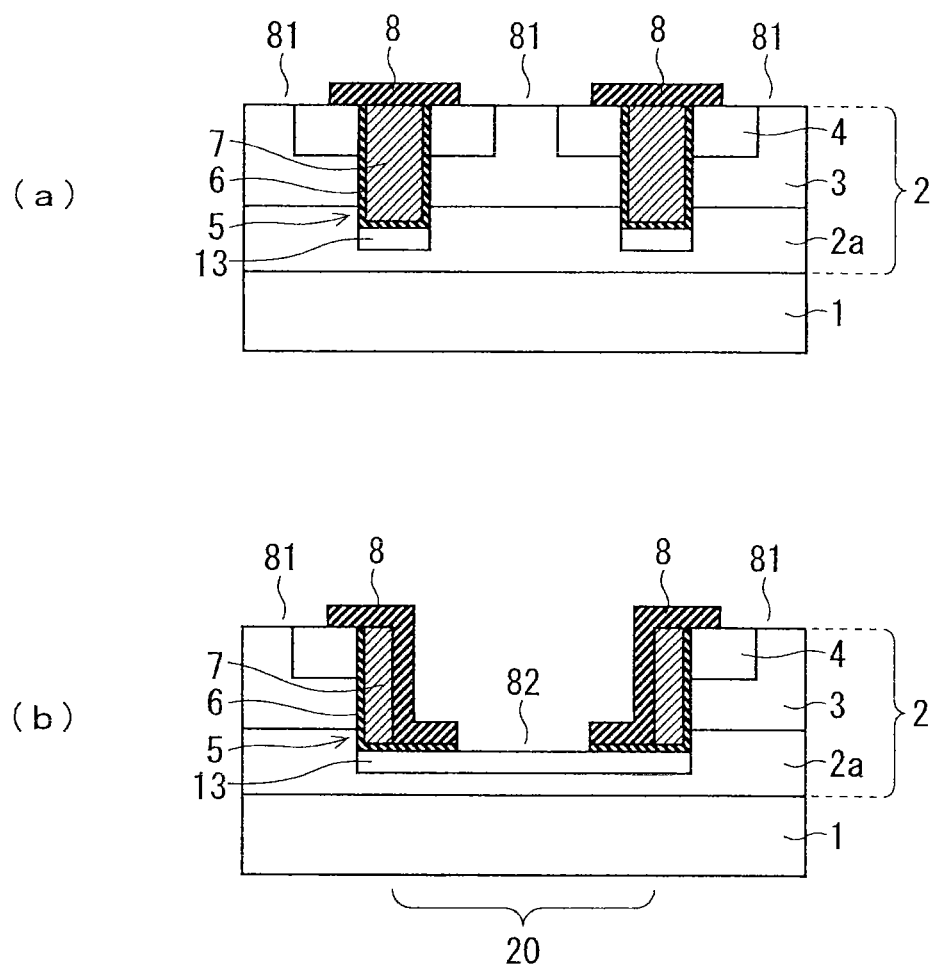
F I G . 9

TRENCH-GATE TYPE SEMICONDUCTOR DEVICE AND MANUFACTURING METHOD THEREFOR

CROSS-REFERENCE TO RELATED APPLICATIONS

The present application is a divisional of U.S. application Ser. No. 13/992,574, filed Jun. 7, 2013, which is based on PCT/JP2011/078022 filed Dec. 5, 2011, and JP 2010-275289 filed Dec. 10, 2010, the entire contents of each of which are incorporated herein by reference.

TECHNICAL FIELD

The present invention relates to a trench-gate type semiconductor device and a manufacturing method therefor.

BACKGROUND ART

In power electronics devices, as switching elements for controlling power supply to loads such as motors, insulating gate type semiconductor devices, such as an IGBT (Insulated Gate Bipolar Transistor) and a MOSFET (Metal Oxide Semiconductor Field Effect Transistor), are widely used. As one of vertical MOSFETs for power control, there is a trench-gate type MOSFET in which a gate electrode is embedded into a semiconductor layer (for example, the following Patent Documents 1 and 2). In general, in a trench-gate type MOSFET, heightening of withstand voltage and lowering of on resistance establish a trade-off relationship.

On the other hand, an attention is paid to a MOSFET and an IGBT using a wide band gap semiconductor of silicon carbide (SiC) or the like as next-generation switching elements that can implement high withstand voltage and low loss, and it is highly expected that they are applied to a technical field that treats high voltage of about 1 kV or more. Besides SiC, for example, gallium nitride (GaN) materials and diamond are used for wide band gap semiconductors.

In a trench-gate type MOSFET using wide band gap semiconductors, avalanche field intensity at a PN junction between a base region and a drift layer is equivalent to dielectric breakdown field intensity of a silicon oxide film to be used for a gate insulating film. For this reason, when a high voltage is applied to a MOSFET, the highest electric field is applied to a gate insulating film at a bottom portion of a trench into which a gate electrode is embedded, and dielectric breakdown of the gate insulating film might occur on that portion.

Patent Documents 1 and 2 propose that in each of n-channel trench-gate type MOSFETs, a p-type diffusion layer (protective diffusion layer) is provided to a bottom portion of a trench in a drift layer in order to protect a gate insulating film at a bottom portion of a trench of the gate electrode. The protective diffusion layer enhances depleting of an n-type drift layer at the time of turning off a MOSFET, and relieves concentration of the electric field to the bottom portion of the trench of the gate electrode. In Patent Documents 1 and 2, the protective diffusion layer is electrically connected with a base region (body region) of the MOSFET, and an electric potential of the protective diffusion layer is fixed, thereby further relieving the concentration of the electric field to the trench bottom portion.

For example, in Patent Document 1 (FIG. 3), a trench of a gate electrode is formed into a line shape, a p-type diffusion layer ($p^{--}$ layer) with low density is extended on a side surface at the end of a longitudinal direction of the trench, and a protective diffusion layer at a bottom portion of the trench is electrically connected to a base region on an upper layer via this $p^{--}$ layer.

Further, in Patent Document 2 (FIGS. 1 and 2), a trench of a gate electrode is formed into a lattice shape, and a contact that connects a protective diffusion layer at a bottom portion of the trench and a source electrode on the upper layer of the gate electrode is provided onto an intersection of the gate electrode so as to penetrate the gate electrode. The protective diffusion layer is electrically connected to the base region via the contacts and the source electrode.

When a MOSFET that switches a high voltage is turned off, a drain voltage abruptly rises (for example, changes from 0 V to a several hundred V). In a MOSFET having a protective diffusion layer at a bottom portion of a trench of a gate electrode, when a drain voltage abruptly rises, a displacement current is applied to the protective diffusion layer via a parasitic capacitance between the protective diffusion layer and a drift layer. This displacement current is determined by a fluctuation (dV/dt) in an area of the protective diffusion layer and a drain voltage (V) with respect to time (t) (Patent Document 3).

Like Patent Documents 1 and 2, when a protective diffusion layer is connected to a base region, a displacement current applied to the protective diffusion layer is applied to a base region. At this time, a voltage drop occurs in a resistance component between the protective diffusion layer and the base region, and this also causes dielectric breakdown of the gate insulating film.

PRIOR ART DOCUMENTS

Patent Documents

Patent Document 1: Japanese Patent No. 4453671
Patent Document 2: Japanese Patent Application Laid-Open No. 2010-109221
Patent Document 3: International Publication No. WO2010/073759

SUMMARY OF THE INVENTION

Problems to be Solved by the Invention

Breakdown of the gate insulating film caused by the displacement current can be prevented by reducing a resistance value between the protective diffusion layer and the base region. However, in the MOSFET of Patent Document 1, since the protective diffusion layer is connected to the base region via the $p^{--}$ layer that extends on the side surface at the end of the longitudinal direction of the line-shaped trench, a distance from the center of the protective diffusion layer at a bottom portion of the trench to the base region is long. For this reason, a resistance value between the protective diffusion layer and the base region becomes large.

Further, since the trench-gate type MOSFET in Patent Document 2 is configured so that the contact for connecting the protective diffusion layer and the base region penetrates the gate electrode, a width of the contact is necessarily narrower than a width of the trench of the gate electrode. For this reason, when a pitch of MOSFET cells, namely, the width of the trench of the gate electrode is reduced in order to increase current density, accordingly the contact should be narrowed, thereby increasing the resistance value between the protective diffusion layer and the base region.

The present invention was devised in order to solve the above problems, and its object is to provide a trench-gate type semiconductor device and a manufacturing method therefor that are capable of preventing breakdown of a gate insulating film caused by a displacement current applied to a protective diffusion layer at a portion of a trench underlying a gate electrode at a turn-off time, and simultaneously narrowing a width of the gate electrode so as to narrow a cell pitch.

Means for Solving the Problems

A semiconductor device of the present invention includes a first conductive type semiconductor layer, a second conductive type base region formed in the upper part of the semiconductor layer, a gate electrode that is embedded into the semiconductor layer so as to penetrate the base region and is disposed into a lattice shape in a planar view, a gate insulating film formed on a side surface and a bottom surface of the gate electrode, a first conductive type source region formed in the upper part of the base region so as to contact with the gate electrode via the gate insulating film, a source electrode that is connected to an upper surface of the source region and an upper surface of the base region, an opening formed so as to penetrate the base region in at least one block of a plurality of blocks divided by the gate electrode, a second conductive type protective diffusion layer formed across a portion underlying of the gate electrode via the gate insulating film and a bottom portion of the opening in the semiconductor layer, a protective contact for connecting the protective diffusion layer and the source electrode through the opening, and an interlayer insulating film interposed between the protective contact and gate electrode.

Effects of the Invention

According to the present invention, since the protective contact that connects the protective diffusion layer and the source electrode is disposed on at least one of the blocks divided by the lattice-shaped gate electrode, an area of the protective contact that is as large as an area of the block can be secured. Therefore, the resistance of the protective contact can be lowered, and a resistance value between the protective diffusion layer and the base region can be small. Therefore, breakdown of the gate insulating film caused by a displacement current can be prevented. Further, since the area of the protective contact is not limited to the width of the trench of the gate electrode, even if a cell pitch is narrowed in order to increase current density, the resistance of the protective contact does not rise.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a process view illustrating a manufacturing method for the semiconductor device according to the first preferred embodiment of the present invention.

FIG. 6 is a process view illustrating the manufacturing method for the semiconductor device according to the first preferred embodiment of the present invention.

FIG. 8 is a process view illustrating the manufacturing method for the semiconductor device according to the first preferred embodiment of the present invention.

FIG. 9 is a process view illustrating the manufacturing method for the semiconductor device according to the first preferred embodiment of the present invention.

EMBODIMENT FOR CARRYING OUT THE INVENTION

First Embodiment

Figure 1:
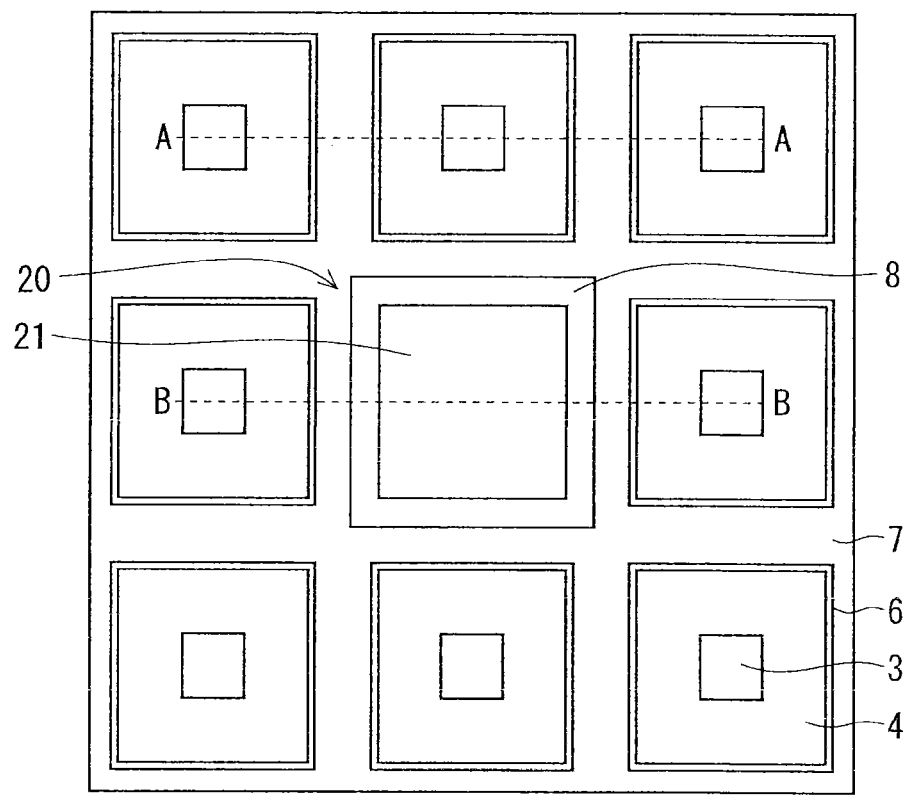
FIG. 1 is a plan view of an epitaxial layer of a semiconductor device according to a first preferred embodiment of the present invention.
Figure 2:
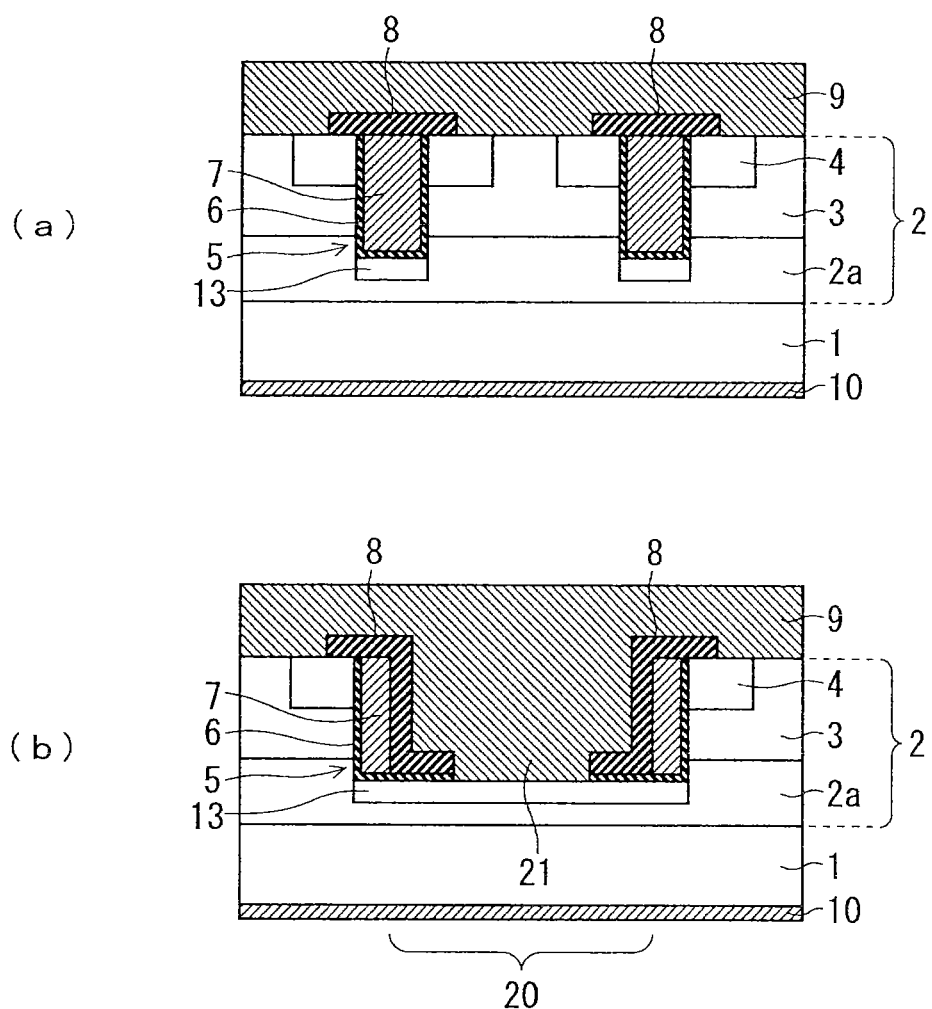
FIG. 2 is a sectional view of the semiconductor device according to the first preferred embodiment of the present invention.

FIG. 1 and FIG. 2 are views each illustrating a configuration of a semiconductor device according to a first preferred embodiment. Here, a trench-gate type MOSFET is illustrated that is a silicon carbide (SiC) semiconductor device as one example of the semiconductor device. FIG. 1 is a plan view of the MOSFET. FIG. 2(a) is a sectional view taken along line A-A of FIG. 1, and illustrates a MOSFET cell forming region (MOSFET cell region). On the other hand, FIG. 2(b) is a sectional view taken along line B-B of FIG. 1, and includes a contact (protective contact) forming region 20 (protective contact region) to be connected to the protective diffusion layer. Details of the protective contact region 20 will be described later.

The MOSFET in the first preferred embodiment is formed by using an epitaxial substrate composed of an n-type SiC substrate 1 and an epitaxial layer 2 (semiconductor layer) of n-type SiC grown thereon. A p-type base region 3 is formed in the upper part of the epitaxial layer 2, and an n-type region of the epitaxial layer 2 where the base region 3 is not formed is a drift layer 2a.

With reference to FIG. 2(a), a configuration of the MOSFET cell will be described. A trench 5 into which the gate electrode 7 is embedded is formed in the epitaxial layer 2 of the MOSFET cell region so as to penetrate the base region 3 of the epitaxial layer 2. That is, a bottom portion of the trench 5 reaches the drift layer 2a below the base region 3. A gate insulating film 6 is provided to a bottom surface and a side surface of the gate electrode 7 (inner surface of the trench 5). An n-type source region 4 is disposed near the gate electrode 7 in an upper surface of the base region 3 so as be adjacent to the gate electrode 7 via the gate insulating film 6.

Further, on a portion underlying the gate electrode 7 (the trench 5) in the drift layer 2a, there is formed a p-type protective diffusion layer 13 that enhances depleting of the drift layer 2a at an off time of the MOSFET and relieves concentration of an electric field to the bottom portion of the trench 5 so as to prevent breakdown of the gate insulating film 6.

An interlayer insulating film 8 is formed on an upper surface of the epitaxial layer 2 so as to cover the gate electrode 7. A contact hole (first contact hole) that reaches the source region 4 and the base region 3 is formed in the interlayer insulating film 8, and a source electrode 9 disposed on the interlayer insulating film 8 connects the source region 4 and the base region 3 through the contact hole. A drain electrode 10 is formed on a lower surface of a SiC substrate 1.

As shown in FIG. 1, the gate electrode 7 is disposed into a lattice shape in a planar view (the protective diffusion layer 13 also extends into a lattice shape similarly to the gate electrode 7). Respective blocks (cells) divided by the gate electrode 7 function as the MOSFET on the MOSFET cell region. In FIG. 1, illustration of the interlayer insulating film 8 and the source electrode 9 on the epitaxial layer 2 is omitted (that is, FIG. 1 corresponds to a top view of the epitaxial layer 2).

In the present invention, at least one of the blocks divided by the gate electrode 7 is the protective contact region 20 on which a protective contact 21 for connecting the protective diffusion layer 13 and the source electrode 9 is disposed. As shown in FIG. 2(b), on the protective contact region 20, the trench 5 that reaches the drift layer 2a under the base region 3 is formed in the whole of the block delimited by the gate electrode 7.

That is, on the protective contact region 20, the trench 5 is a rectangular opening and the gate electrode 7 is formed on its outer peripheral portion. Further, the interlayer insulating film 8 is formed so as to cover an upper surface of the gate electrode 7 and a side surface facing the protective contact region 20.

Further, the protective diffusion layer 13 is formed at the bottom portion of the trench 5 (rectangular opening) of the protective contact region 20, and this protective diffusion layer 13 is connected to the protective diffusion layer 13 at the portion underlying the gate electrode 7 of peripheral MOSFET cells. That is, the protective diffusion layer 13 is formed continuously with the bottom portion of the trench 5 over the MOSFET cell region and the protective contact region 20. Further, since the protective diffusion layer 13 extends into a lattice shape similarly to the gate electrode 7, the protective diffusion layer 13 of the protective contact region 20 is connected to the protective diffusion layer 13 of all the peripheral MOSFET cells.

The source electrode 9 on the interlayer insulating film 8 extends also inside the protective contact region 20. A contact hole (second contact hole) that reaches the protective diffusion layer 13 is formed in the interlayer insulating film 8 in the protective contact region 20, and the source electrode 9 is connected to the protective diffusion layer 13 of the protective contact region 20 through the contact hole. That is, the protective contact 21 shown in FIG. 2(b) is a part of the source electrode 9 extending inside the protective contact region 20.

Insulation is made between the protective contact 21 and the gate electrode 7 by the interlayer insulating film 8 that covers the side surface of the gate electrode 7. In the first preferred embodiment, since the trench 5 is formed on in the whole of the block delimited by the gate electrode 7 on the protective contact region 20, the protective contact 21 is adjacent to the gate electrode 7 via the interlayer insulating film 8. With this configuration, since the area of the protective contact 21 is widened to a maximum extent, resistance of the protective contact 21 can be reduced.

An operation of the MOSFET will be simply described. When a positive voltage that is not less than a threshold voltage is applied to the gate electrode 7, an inversion channel layer is formed in the base region 3 (channel region) on the side surface of the gate electrode 7. This inversion channel layer becomes a path through which electrons flow as carriers from the source region 4 to the drift layer 2a. The electrons that flow from the source region 4 to the drift layer 2a through the inversion channel layer pass through the SiC substrate 1 to reach the drain electrode 10 according to an electric field generated by the positive voltage of the drain electrode 10. As a result, the MOSFET can cause an electric current to flow from the drain electrode 10 to the source electrode 9. This state is a MOSFET on state.

On the other hand, when a voltage that is lower than the threshold voltage is applied to the gate electrode 7, the inversion channel is not formed in the channel region, and thus an electric current does not flow between the drain electrode 10 and the source electrode 9. This state is a MOSFET off state.

As described above, when the MOSFET is turned off, the voltage of the drain electrode 10 abruptly rises, and thus a displacement current flows into the protective diffusion layer 13 via parasitic capacitance between the protective diffusion layer 13 and the drift layer 2a. At this time, a voltage drop occurs in a resistance component between the protective diffusion layer 13 and the base region 3, and when this increases, dielectric breakdown of the gate insulating film 6 occurs. In order to prevent the breakdown of the gate insulating film 6 caused by the displacement current, it is effective that a resistance value between the protective diffusion layer 13 and the base region 3 is reduced.

In the MOSFET of the first preferred embodiment, at least one of the blocks defined by the lattice-shaped gate electrode 7 is the protective contact region 20 for disposing the protective contact 21 for connecting the source electrode 9 connected to the base region 3 and the protective diffusion layer 13. For this reason, a large forming area of the protective contact 21 can secured, and the resistance value of the protective contact 21 can be reduced. Therefore, the resistance value between the protective diffusion layer 13 and the base region 3 is reduced, thereby preventing the breakdown of the gate insulating film 6 caused by the displacement current.

Further, since the area of the protective contact 21 is not limited to the width of the trench 5, even if a cell pitch (a width of the trench 5) is narrowed in order to increase a current density, the resistance of the protective contact 21 is not high. Therefore, this preferred embodiment can contribute to both heightening of withstand voltage and increase in capacity of the MOSFET.

Since the protective diffusion layer 13 of the protective contact region 20 is connected to the protective diffusion layer 13 of all the peripheral MOSFET cells, at least one of the blocks (cells) defined by the lattice-shaped gate electrode 7 may be the protective contact region 20. However, in an apparatus having a lot of MOSFET cells, a plurality of protective contact regions 20 may be disposed so that a distance from each of the MOSFET cells to the protective contact region 20 is not long. In this case, the protective contact regions 20 may be disposed at an equal interval so that the path of the electric current flowing in the MOSFET cells becomes uniform.

More preferably, one of centers in each nine blocks may be the protective contact region 20 as shown in FIG. 1. In this case, the intervals of the protective contact regions 20 are equal to each other, and all the MOSFET cells are adjacent to the protective contact region 20, and thus the resistance between the protective diffusion layer 13 of each MOSFET cell and the protective contact region 20 can be reduced.

A MOSFET manufacturing method shown in FIG. 1 and FIG. 2 will be described below. FIG. 3 to FIG. 10 are process views each illustrating the manufacturing method. In these drawings, (a) and (b) each correspond to cross sections of FIG. 2(a) and a region corresponding to FIG. 2(a).

The epitaxial layer 2 (semiconductor layer) is first formed on the SiC substrate 1. Here, the n-type SiC substrate 1 of low resistance having 4H-polytype is prepared, and the n-type drift layer 2a is epitaxially grown thereon by the Chemical Vapor Deposition (CVD) method. The drift layer 2a has impurity density of $1\times10^{15}$ cm$^{-3}$ to $1\times10^{17}$ cm$^{-3}$, and a thickness of 5 to 50 μm.

A predetermined dopant is then ion-implanted into the surface of the epitaxial layer 2, so that the base region 3 and the source region 4 are formed (FIG. 3). The base region 3 is formed by ion implantation of aluminum (Al) as p-type impurity. A depth of the Al ion implantation is about 0.5 to 3 μm that is within a range that does not exceed a thickness of the epitaxial layer 2. An impurity density of Al to be implanted is set to be higher than the n-type impurity density of the epitaxial layer 2. At this time, a region of the epitaxial layer 2 whose depth is deeper than the Al implantation depth remains as the n-type drift layer 2a.

The base region 3 may be formed by the epitaxial growth. In this case, the impurity density and a thickness of the base region 3 are equivalent to those in a case of forming by means of the ion plantation.

The source region 4 is formed by ion-implanting nitrogen (N) as an n-type impurity into the surface of the base region 3. The source region 4 is formed by the lattice-shaped pattern corresponding to a layout of the gate electrode 7 (the trench 5) to be formed next (see FIG. 1). As a result, when the gate electrode 7 is formed, the source region 4 is disposed on both sides of the gate electrode 7. An N ion-implanting depth should be shallower than the thickness of the base region 3. The impurity density of N to be implanted is set to be higher than the p-type impurity density of the base region 3, and is within a range of $1\times10^{18}$ cm$^{-3}$ to $1\times10^{21}$ cm$^{-3}$.

Figure 4:
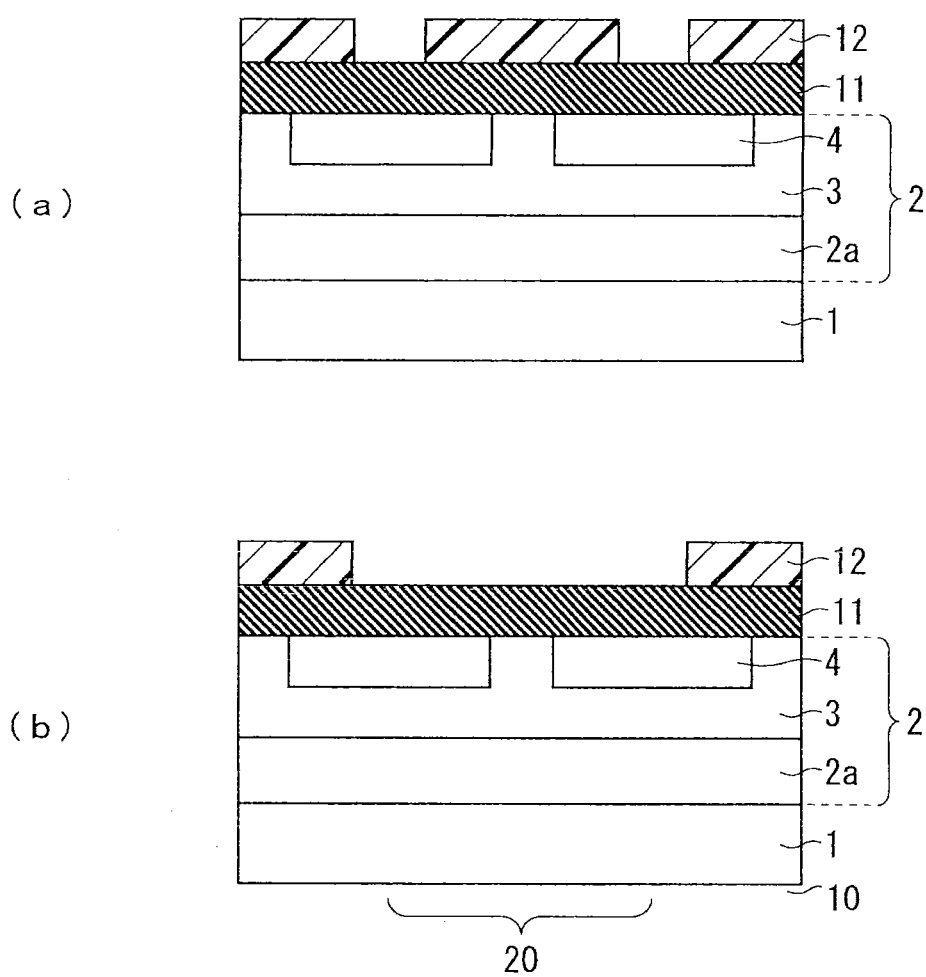
FIG. 4 is a process view illustrating the manufacturing method for the semiconductor device according to the first preferred embodiment of the present invention.

Thereafter, a silicon oxide film layer 11 is deposited into about 1 to 2 μm on the surface of the epitaxial layer 2, and an etching mask 12 made of a resist material is formed thereon (FIG. 4). The etching mask 12 is formed into a pattern where the forming region of the trench 5 is opened by a photolithography technique. Since the trench 5 has the lattice shape, the etching mask 12 has a matrix pattern obtained by inverting it. Since the protective contact region 20 is entirely opened, the etching mask 12 has a matrix pattern where a portion corresponding to the protective contact region 20 is lacked.

Figure 5:
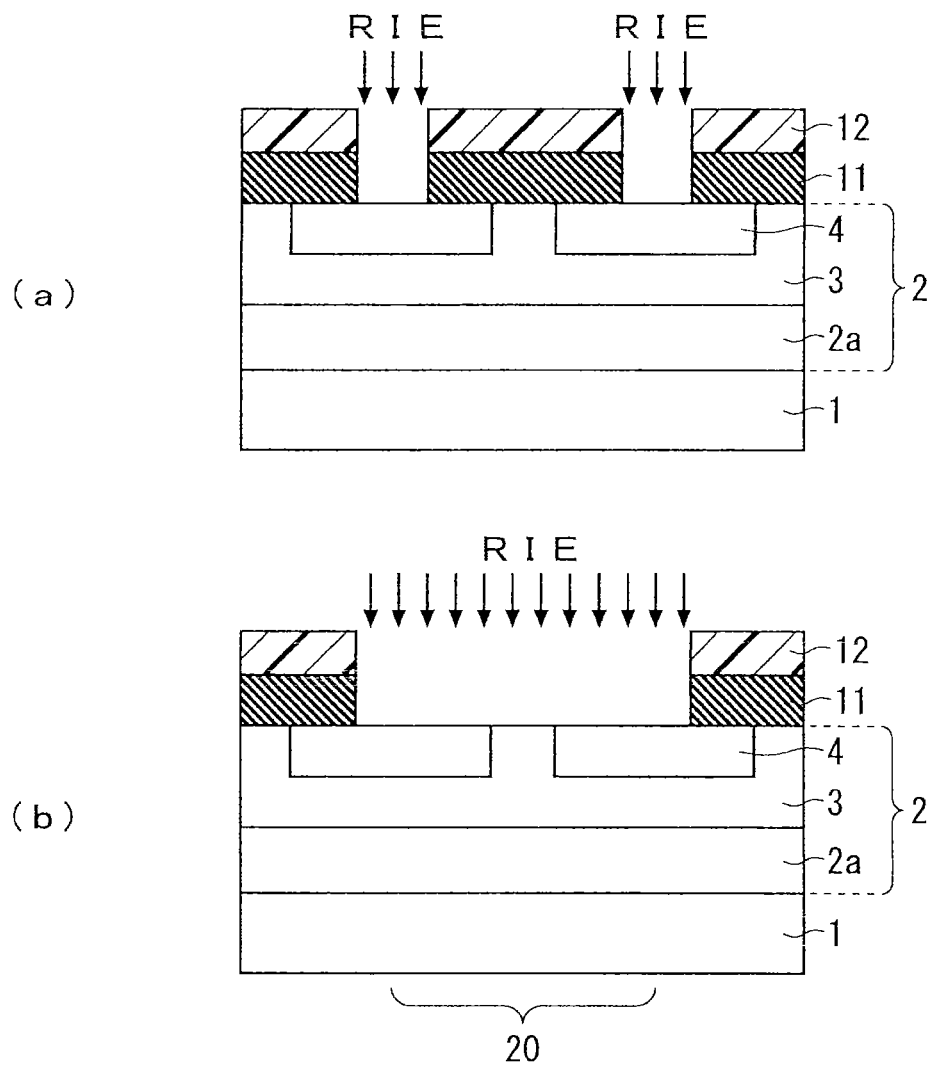
FIG. 5 is a process view illustrating the manufacturing method for the semiconductor device according to the first preferred embodiment of the present invention.

The silicon oxide film 11 is then patterned by a reactive ion etching (RIE) process using the etching mask 12 as a mask (FIG. 5). That is, the pattern of the etching mask 12 is transferred onto the silicon oxide film 11. The silicon oxide film 11 that is subject to the patterning becomes an etching mask at next step.

The trench 5 that penetrates the source region 4 and the base region 3 is formed in the epitaxial layer 2 by RIE that uses the silicon oxide film layer 11 that is subject to the patterning as a mask (FIG. 6). At this time, the trench 5 formed in the protective contact region 20 has a rectangular shape including the entire protective contact region 20. The depth of the trench 5 is deeper than the depth of the base region 3, and is about 0.5 to 3 μm.

Figure 7:
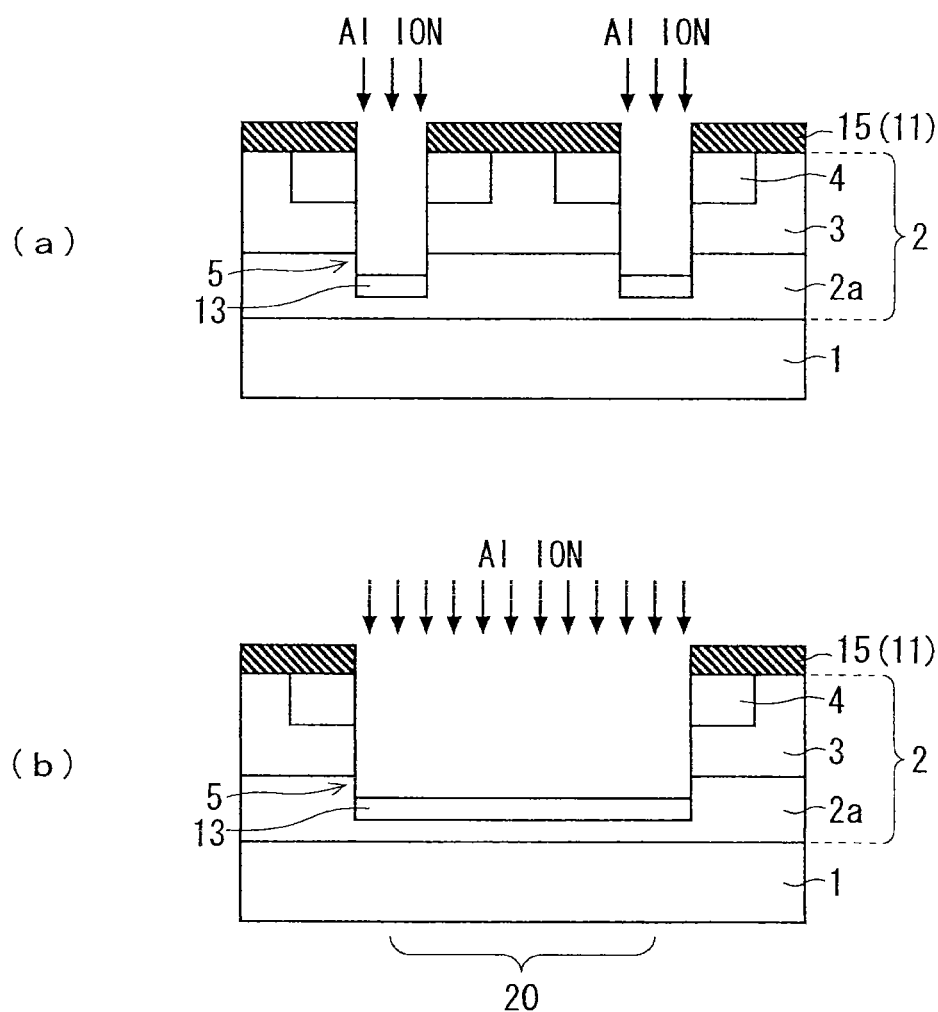
FIG. 7 is a process view illustrating the manufacturing method for the semiconductor device according to the first preferred embodiment of the present invention.

Thereafter, an implantation mask 15 having a pattern where a portion of the trench 5 is opened (a matrix shape where a part is lacked similarly to the etching mask 12) is formed, and ion implantation using the implantation mask as a mask allows the p-type protective diffusion layer 13 to be formed at the bottom portion of the trench 5 (FIG. 7). Here, Al is used as a p-type impurity. Instead of the implantation mask 15, the silicon oxide film 11 that is an etching mask (patterned) at the time of forming the trench 5 may be used. As a result, manufacturing steps can be simplified and a cost can be reduced. When the silicon oxide film 11 is used instead of the implantation mask 15, after the trench 5 is formed, the thickness and an etching condition of the silicon oxide film layer 11 should be adjusted so that the silicon oxide film 11 having a certain degree of thickness remains.

After the implantation mask 15 is removed, anneal for activating N and Al that are ion-implanted at the above steps is carried out by using thermal treatment equipment. This anneal is carried out in an inert gas atmosphere such as argon (Ar) gas under conditions of 1300 to 1900° C. and 30 sec. to 1 hr.

After the silicon oxide film is formed on the entire surface of the epitaxial layer 2 including the inside of the trench 5, polysilicon is deposited by a low pressure CVD method and is patterned or etched back so that the gate insulating film 6 and the gate electrode 7 are formed in the trench 5 (FIG. 8). The silicon oxide film to be the gate insulating film 6 may be formed by thermally oxidizing the surface of the epitaxial layer 2 or by depositing it on the epitaxial layer 2.

In the MOSFET cell region, as shown in FIG. 8(a), the gate electrode 7 is embedded into the entire trench 5. On the other hand, in the trench 5 (the rectangular opening) of the protective contact region 20, the gate electrode 7 at a center portion is removed by performing patterning or etchback in order to secure a region where the protective contact 21 is formed so that the gate electrode 7 remains only on an outer peripheral portion as shown in FIG. 8(b).

Thereafter, the interlayer insulating film 8 is formed on the entire surface of the epitaxial layer 2 by the low pressure CVD method so as to cover the gate electrode 7. The interlayer insulating film 8 is then patterned so that a first contact hole 81 that reaches the source region 4 and the base region 3, and a second contact hole 82 that reaches the protective diffusion layer 13 at the bottom portion of the trench 5 of the protective contact region 20 are formed (FIG. 9).

Figure 10:
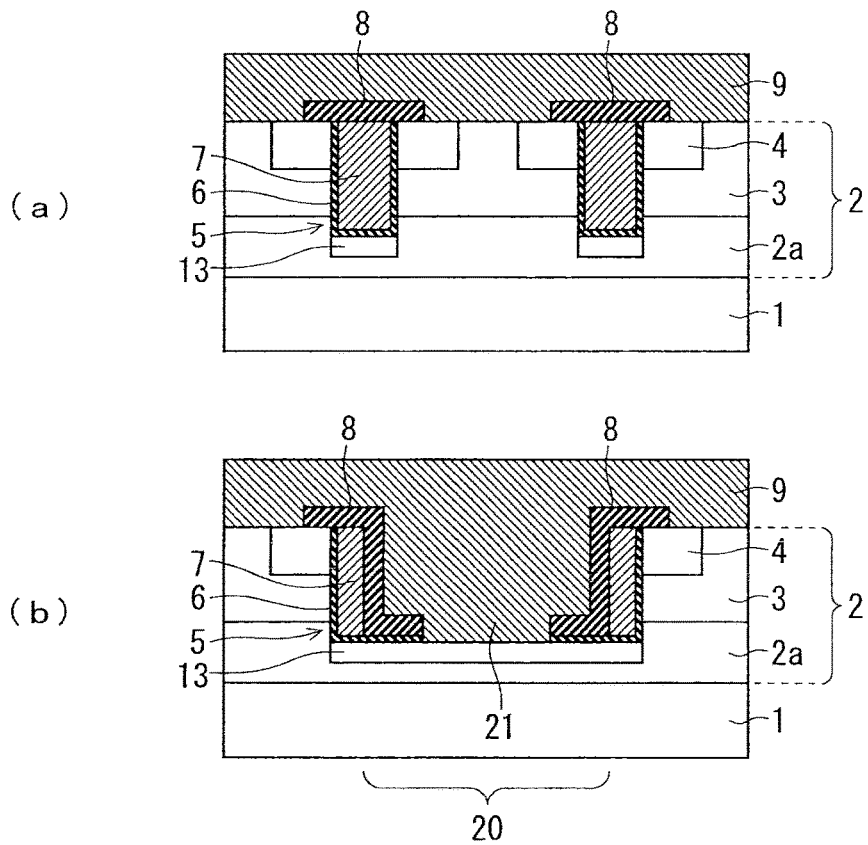
FIG. 10 is a process view illustrating the manufacturing method for the semiconductor device according to the first preferred embodiment of the present invention.

An electrode material such as Al alloy is then deposited on the epitaxial layer 2 so that the source electrode 9 is formed on the interlayer insulating film 8 and in the first and second contact holes 81 and 82. On the source electrode 9, a portion that extends inside the protective contact region 20 becomes the protective contact 21 (FIG. 10). Finally, an electrode material such as Al alloy is deposited on the lower surface of the SiC substrate 1 so that the drain electrode 10 is formed, thereby obtaining the MOSFET having the configuration shown in FIG. 1.

Figure 11:
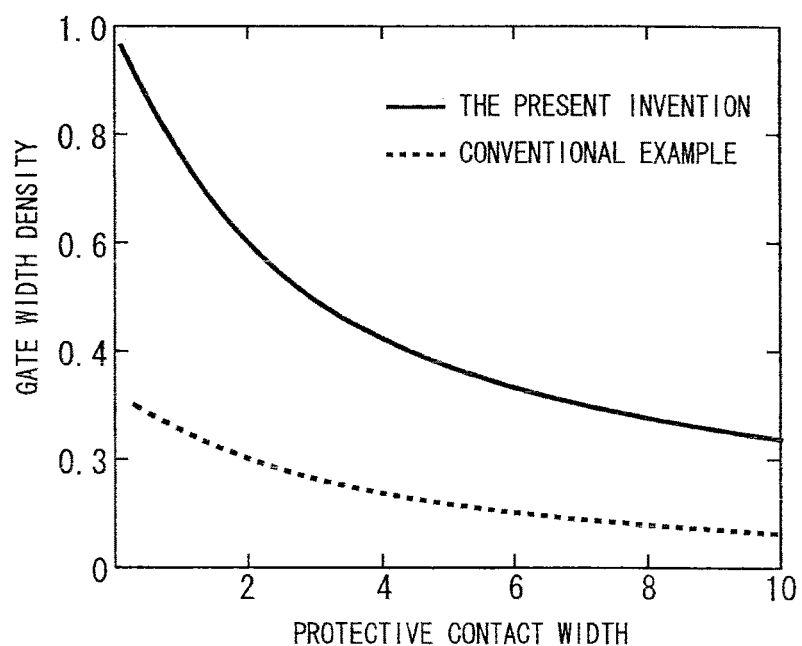
FIG. 11 is a graph illustrating an estimation result of gate width density with respect to a protective contact width.

FIG. 11 is a graph illustrating an estimation result of the gate width density with respect to the width of the protective contact (a ratio of a gate width of the entire MOSFET to the total area of the MOSFET). In this drawing, a solid line of the graph indicates the case of the present invention, and a broken line of the graph indicates a case of a conventional example where the protective contact penetrates the gate electrode between the cells (for example, Patent Document 2).

In the case of the conventional example, since an opening having a width corresponding to a sum of the width of the protective contact and the thickness of the interlayer insulating film should be provided in the gate electrode between the MOSFET cells in order to provide the protective contact, the width of the opening becomes comparatively large, and accordingly the gate width density is reduced. On the other hand, in the present invention, since the width of the trench 5 between the cells can be uniform irrespective of the width of the protective contact 21, the gate width density can be larger than the conventional example.

Second Embodiment

As described in the first preferred embodiment, the gate electrode 7 can be formed by any one of the patterning and etchback methods. However, when the trench 5 of the protective contact region 20 is formed into a tapered shape and the gate electrode 7 is tried to be formed by etchback, the gate electrode 7 disposed in the trench 5 of the protective contact region 20 might be completely removed.

The above problem is solved by forming the gate electrode 7 through the patterning. However, in this case, since the end of the gate electrode 7 is positioned on the upper surface of the epitaxial layer 2, the width of the gate electrode 7 becomes wider than the width of the trench 5. Therefore, from a viewpoint of narrowing of the pitch of the MOSFET cells, it is advantageous to obtain the gate electrode 7 through etchback.

In the second preferred embodiment, therefore, only the gate electrode 7 disposed in the trench 5 of the protective contact region 20 is formed by patterning, and the gate electrode 7 on the other parts (the gate electrode 7 disposed on the MOSFET cell region) is formed by etchback.

Figure 12:
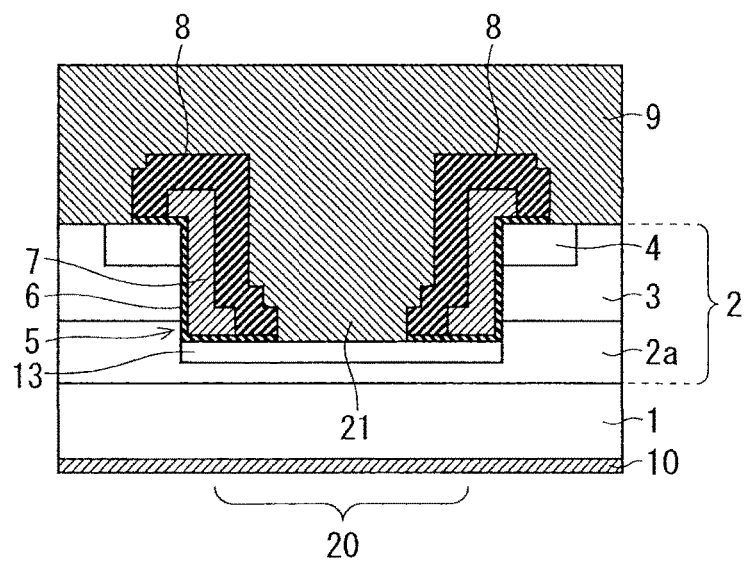
FIG. 12 is a sectional view of the semiconductor device according to a second preferred embodiment of the present invention.

FIG. 12 is a sectional view of the protective contact region 20 in the semiconductor device according to the second preferred embodiment (corresponding to a cross section taken along line B-B of FIG. 1). The configuration of the MOSFET cell region is similar to the first preferred embodiment (FIG. 2(a)).

The gate electrode 7 disposed in the trench 5 of the protective contact region 20 is formed by patterning a material film of the gate electrode 7 (for example, polysilicon). Therefore, as shown in FIG. 12, the ends of the gate electrode 7 and the gate insulating film 6 around the protective contact region 20 extend onto the epitaxial layer 2 (that is, the ends of the gate electrode 7 and the gate insulating film 6 are positioned on the epitaxial layer 2).

On the other hand, the gate electrode 7 disposed in the trench 5 other than the protective contact region 20 is formed by etching back the material film of the gate electrode 7 (for example, polysilicon). Therefore, in the MOSFET cell region, the entire gate electrode 7 is embedded into the trench 5 as shown in FIG. 2(a).

According to this preferred embodiment, the gate electrode 7 in the trench 5 of the protective contact region 20 can be prevented from being eliminated without widening the pitch of the MOSFET cells.

Third Embodiment

Figure 13:
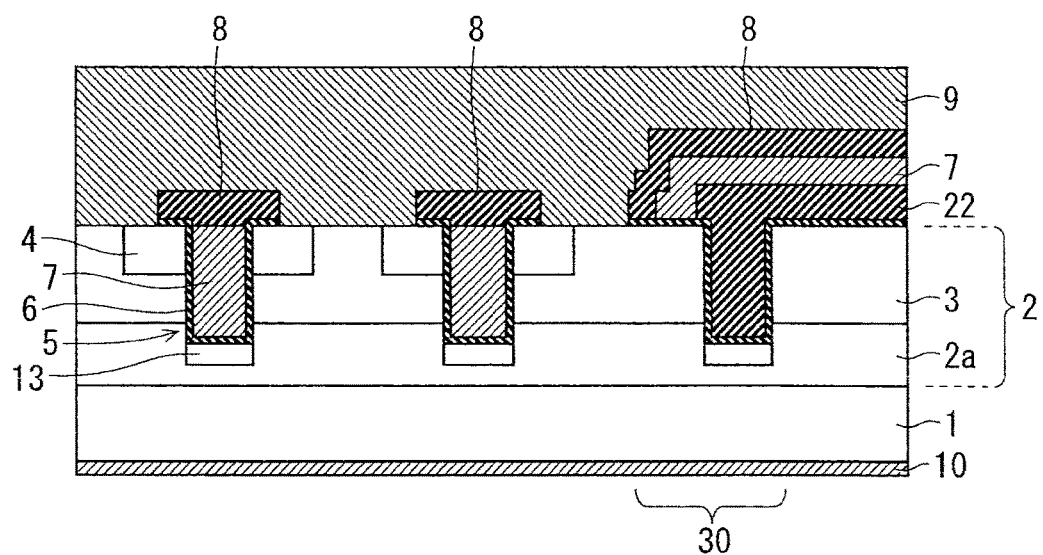
FIG. 13 is a sectional view of the semiconductor device according to a third preferred embodiment of the present invention.

FIG. 13 is a sectional view illustrating the configuration of the semiconductor device according to the third preferred embodiment of the present invention, and illustrates a cross section of an outermost peripheral portion of a MOSFET cell array of the semiconductor device. In this preferred embodiment, a dummy cell 30 that does not function as a MOSFET is disposed so as to be adjacent on an outer side of the outermost peripheral MOSFET cells. The dummy cells 30 are arranged so as to surround the MOSFET cell array. A configuration of the MOSFET cell array (including the protective contact region 20) other than the outermost peripheral portion is similar to that in the first or second preferred embodiment.

As shown in FIG. 13, the dummy cell 30 has the trench 5 that penetrates the base region 3 similarly to the MOSFET cells, but the inside of the trench 5 is filled with a part of a field insulating film 22 to be formed on an outer peripheral region of the semiconductor device. The trench 5 of the dummy cell 30 into which the field insulating film 22 is embedded and the trench 5 of the MOSFET cells into which the gate electrode 7 is embedded form a continuous lattice-shaped pattern in a planar view. That is, the portion of the field insulating film 22 that is embedded into the trench 5 of the dummy cell 30 is disposed on the outer periphery of the lattice-shaped gate electrode 7 so as to form a lattice-shaped pattern together with the gate electrode 7 in a planar view.

The gate electrode 7 formed by patterning is disposed on the field insulating film 22. The gate electrode 7 on the field insulating film 22 is electrically connected to the gate electrode 7 of the MOSFET cell region and the protective contact region 20 on a region, not shown.

Further, the gate electrode 7 on the field insulating film 22 is also covered with the interlayer insulating film 8, and the source electrode 9 that extends from the MOSFET cell region is formed thereon. On the upper surface of the epitaxial layer 2, the source electrode 9 is connected to the base region 3 and the source region 4 of the MOSFET cells and the dummy cells 30, respectively, through the contact hole formed in the interlayer insulating film 8.

According to this preferred embodiment, since the dummy cell 30 having the trench 5 filled with the field insulating film 22 is disposed on the outer side of the outermost peripheral MOSFET cells, the gate insulating film 6 of the outermost peripheral MOSFET cells is not substantially exposed on the outermost periphery of the MOSFET cell array. Therefore, occurrence of concentration of the electric field on the gate insulating film 6 of the outermost peripheral MOSFET cells is repressed, thereby preventing breakdown of the gate insulating film 6.

Fourth Embodiment

Figure 14:
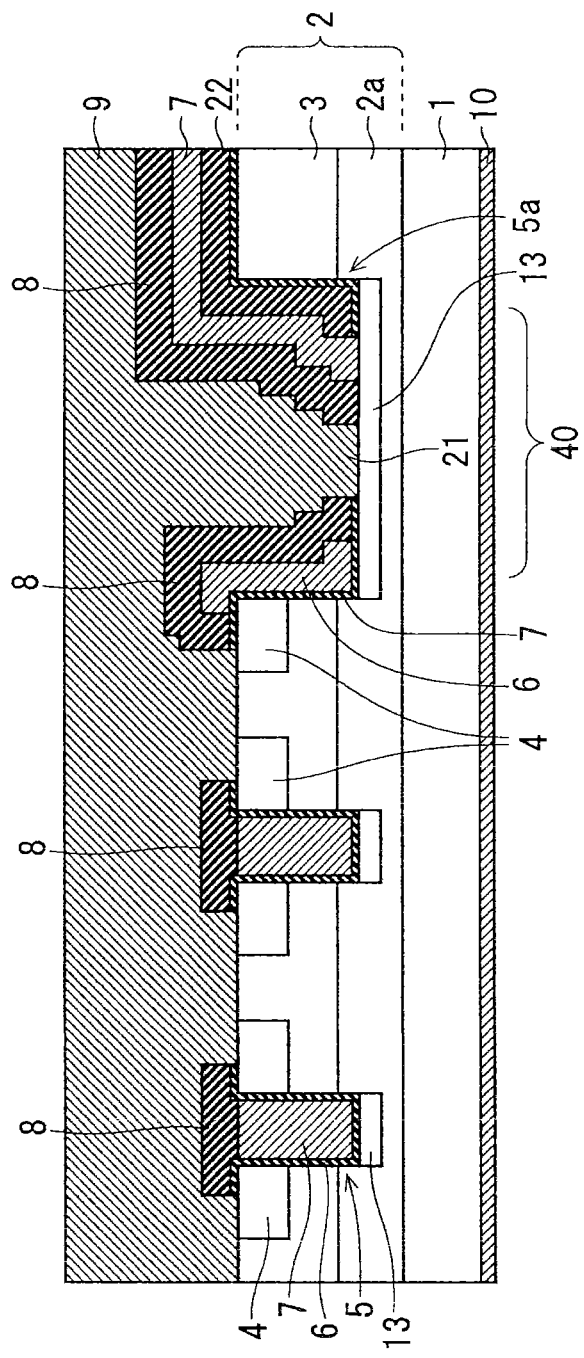
FIG. 14 is a sectional view of the semiconductor device according to a fourth preferred embodiment of the present invention.

FIG. 14 is a sectional view illustrating the configuration of the semiconductor device according to the fourth preferred embodiment of the present invention, and illustrates a cross section of the outermost peripheral portion of the MOSFET cell array in the semiconductor device. In this preferred embodiment, an outermost peripheral protective contact region 40 where the protective contact 21 is disposed is provided so as to surround the outside of the outermost peripheral MOSFET cells. A configuration of the MOSFET cell array (including the protective contact region 20) other than the outermost peripheral portion is similar to that in the first or second preferred embodiment.

An outermost peripheral trench 5a with a wide width that penetrates the base region 3 is formed on the outermost peripheral protective contact region 40. The outermost peripheral trench 5a is connected to the trench 5 of the MOSFET cell region and the protective contact region 20, and corresponds to the lattice-shaped pattern outermost peripheral portion formed by the trench 5.

The outermost peripheral portion of the lattice-shaped gate electrode 7 along the trench 5 is disposed in the outermost peripheral trench 5a. Further, the protective diffusion layer 13 is formed at the bottom portion of the outermost peripheral trench 5a, and this protective diffusion layer is connected to the protective diffusion layer 13 of the MOSFET cell region and the protective contact region.

The gate electrode 7 is formed on the side surface of an inner peripheral side of the outermost peripheral trench 5a (the side of the MOSFET cell array) with the gate insulating film 6 therebetween. Further, the source region 4 of the outermost peripheral MOSFET cells is formed so as to be adjacent to the gate electrode 7 with the gate insulating film 6 therebetween. Therefore, the side surface on the inner peripheral side of the outermost peripheral trench 5a functions also as a part of a channel of the outermost peripheral MOSFET cells.

On the other hand, the side surface on the outer peripheral side of the outermost peripheral trench 5a is covered with a part of the field insulating film 22 that is thicker than the gate insulating film 6 formed on the outer peripheral region of the semiconductor device, and the gate electrode 7 formed by patterning is disposed thereon. The gate electrode 7 on the field insulating film 22 is electrically connected to the gate electrode 7 of the MOSFET cell region and the protective contact region 20 on a region, not shown.

The gate electrode 7 disposed in the outermost peripheral trench 5a is also covered with the interlayer insulating film 8, and the source electrode 9 that extends from the MOSFET cell region is formed on the interlayer insulating film 8. A part of the source electrode 9 is connected to the protective diffusion layer 13 at the bottom portion of the outermost peripheral trench 5a through the contact hole formed in the interlayer insulating film 8 in the outermost peripheral trench 5a. In other words, a part of the source electrode 9 extending on the outermost peripheral protective contact region 40 is embedded into the contact hole that reaches the protective diffusion layer 13, and that portion is the protective contact 21 (outermost peripheral protective contact) for connecting the source electrode 9 and the protective diffusion layer 13.

According to this preferred embodiment, since the protective contact 21 is disposed on the outermost peripheral protective contact region 40 surrounding the MOSFET cell array, the contact resistance between the protective diffusion layer 13 and the protective contact 21 can be reduced. Further, the gate insulating film 6 of the outermost peripheral MOSFET cells is not substantially exposed on the outermost periphery of the MOSFET cell array. Therefore, occurrence of concentration of the electric field in the gate insulating film 6 of the outermost peripheral MOSFET cells is repressed, thereby preventing breakdown of the gate insulating film 6. Further, as described above, the side surface on the inner peripheral side of the outermost peripheral trench 5a can be used also as the channel of the MOSFET.

The above description illustrates the MOSFET having the configuration where the drift layer 2a and the substrate 1 (buffer layer) have the same conductive type, but can be applied also to an IGBT having a configuration where the drift layer 2a and the substrate 1 have different conductive types. For example, the configuration shown in FIG. 1 is changed into the configuration of an IGBT by using the p-type SiC substrate 1. In this case, the source region 4 and the source electrode 9 of the MOSFET correspond to an emitter region and an emitter electrode of an IGBT, respectively, and the drain electrode 10 of the MOSFET corresponds to a collector electrode.

The respective preferred embodiments describe the semiconductor device that is formed by using SiC that is one of wide band gap semiconductors, but they can be applied also to semiconductor devices using the other wide band gap semiconductors such as gallium nitride (GaN) materials and diamond.

While the invention has been shown and described in detail, the foregoing description is in all aspects illustrative and not restrictive. It is therefore understood that numerous modifications and variations can be devised without departing from the scope of the invention.

EXPLANATIONS OF LETTERS OR NUMERALS

1: SiC substrate, 2: epitaxial layer, 2a: drift layer, 3: base region, 4: source region, 5: trench, 6: gate insulating film, 7: gate electrode, 8: interlayer insulating film, 9: source electrode, 10: drain electrode, 11: silicon oxide film, 12: etching mask, 13: protective diffusion layer, 14: protective contact, 15: implantation mask, 20: protective contact region, 21: protective contact, 81: first contact hole, 82: second contact hole.

The invention claimed is:

1. A semiconductor device, comprising:
   a first conductive type semiconductor layer;
   a second conductive type base region disposed in an upper part of said semiconductor layer;
   a gate electrode disposed in a trench which penetrates said base region;
   a gate insulating film disposed on a side surface and a bottom surface of said gate electrode;
   a first conductive type source region disposed in an upper part of said base region and contacting with said gate electrode via said gate insulating film;
   a source electrode connected to said source region and said base region; and
   a protective diffusion layer of the second conductivity type having a first protective diffusion layer and a second protective diffusion layer;
   wherein said first protective diffusion layer of the second conductivity type is disposed between said semiconductor layer and said gate insulating film at a position lower than said gate insulation film;
   said second protective diffusion layer of the second conductivity type is disposed in a bottom of an opening disposed in said base region in a protective contact region, said opening having a broader width than a width of said trench;
   said first and second protective diffusion layers are in contact with each other via a second conductivity type region; and
   said source electrode has an electrical connection to said second protective diffusion layer through said opening without a PN junction such that current flows into said protective diffusion layer from said source electrode.

2. The semiconductor device according to claim 1, wherein said source electrode is connected to said protective diffusion layer between said gate electrodes adjacent to each other.

3. The semiconductor device according to claim 1,
wherein a depth of said opening is equal to that of said trench.

4. The semiconductor device according to claim 1,
wherein in said opening, said gate electrode and said source electrode are disposed adjacent to each other via an interlayer insulating film.

5. The semiconductor device according to claim 1,
wherein said source electrode is connected to said protective diffusion layer at a position lower than said base region.

6. The semiconductor device according to claim 1,
wherein said gate electrode is further disposed on an outer peripheral portion in said opening, and
an interlayer insulating film is disposed in said opening to insulate said gate electrode and said source electrode.

7. The semiconductor device according to claim 1,
wherein said semiconductor layer is made of silicon carbide.

8. A semiconductor device, comprising:
a first conductive type semiconductor layer:
a second conductive type base region disposed in an upper part of said semiconductor layer;
a gate electrode disposed in a trench which penetrates said base region and dividing said semiconductor layer into a plurality of blocks;
a gate insulating film disposed on a side surface and a bottom surface of said gate electrode;
a first conductive type source region disposed in an upper part of said base region and contacting with said gate electrode via said gate insulating film;
a source electrode connected to said source region and said base region; and
a protective diffusion layer of the second conductivity type having a first protective diffusion layer and a second protective diffusion layer;
wherein said first protective diffusion layer of the second conductivity type is disposed between said semiconductor layer and said gate insulating film at a position lower than said gate insulation film;
said second protective diffusion layer of the second conductivity type is disposed in a bottom of an opening disposed in said base region in a protective contact region, said opening being disposed in at least one of said plurality of said blocks;
said first and second protective diffusion layers are in contact with each other via a second conductivity type region; and
said source electrode has an electrical connection to said second protective diffusion layer through said opening without a PN junction such that current flows into said protective diffusion layer from said source electrode.

9. The semiconductor device according to claim 8,
wherein a depth of said opening is equal to that of said trench.

10. The semiconductor device according to claim 8,
wherein said source electrode is connected to said protective diffusion layer at a position lower than said base region.

11. The semiconductor device according to claim 8,
wherein said gate electrode is disposed in a lattice shape in a planar view.

12. The semiconductor device according to claim 11,
wherein said plurality of said blocks includes at least nine blocks comprising three columns and three rows;
and said opening is located in a center block of said nine blocks.

13. The semiconductor device according to claim 11,
wherein said plurality of said blocks is arranged in a matrix shape.

14. The semiconductor device according to claim 8,
wherein said opening is disposed entirely in at least one of said plurality of said blocks.

15. The semiconductor device according to claim 8,
wherein said gate electrode is further disposed on an outer peripheral portion in said opening, and
an interlayer insulating film is disposed in said opening to insulate said gate electrode and said source electrode.

16. The semiconductor device according to claim 8,
wherein said semiconductor layer is made of silicon carbide.

* * * * *